US006979886B2

(12) United States Patent
Hung et al.

(10) Patent No.: US 6,979,886 B2
(45) Date of Patent: Dec. 27, 2005

(54) SHORT-PREVENTED LEAD FRAME AND METHOD FOR FABRICATING SEMICONDUCTOR PACKAGE WITH THE SAME

(75) Inventors: Jui-Hsiang Hung, Chunghua (TW); Chin-Teng Hsu, Taichung (TW); Cheng-Hsiung Yang, Taichung (TW); Chih-Jen Yang, Taichung (TW)

(73) Assignee: Siliconware Precision Industries Co., Ltd., (TW)

( * ) Notice: Subject to any disclaimer, the term of this patent is extended or adjusted under 35 U.S.C. 154(b) by 0 days.

(21) Appl. No.: 10/109,781

(22) Filed: Mar. 29, 2002

(65) Prior Publication Data

US 2003/0141577 A1 Jul. 31, 2003

(30) Foreign Application Priority Data

Jan. 31, 2002 (TW) ................................. 91101619 A

(51) Int. Cl.[7] .......................................... H01L 23/495
(52) U.S. Cl. ....................... 257/666; 257/672; 257/673; 257/674
(58) Field of Search ................. 257/666, 672, 257/673, 674; 29/827; 438/123, 124, FOR 380

(56) References Cited

U.S. PATENT DOCUMENTS

| 4,283,839 | A | * | 8/1981 | Gursky ......................... 228/170 |
| 5,466,966 | A | * | 11/1995 | Ito ............................... 257/666 |
| 6,025,640 | A | * | 2/2000 | Yagi et al. ................... 257/666 |
| 6,075,284 | A | * | 6/2000 | Choi et al. ................... 257/676 |
| 6,078,098 | A | * | 6/2000 | Ewer ........................... 257/667 |
| 6,081,029 | A |   | 6/2000 | Yamaguchi .................. 257/718 |
| 6,166,430 | A | * | 12/2000 | Yamaguchi .................. 257/666 |
| 6,211,462 | B1 | * | 4/2001 | Carter et al. ................. 174/52.4 |
| 6,229,200 | B1 |   | 5/2001 | Mclellan et al. ............. 257/666 |
| 6,448,633 | B1 | * | 9/2002 | Yee et al. ..................... 257/666 |
| 6,455,356 | B1 | * | 9/2002 | Glenn et al. .................. 438/123 |
| 6,462,424 | B1 | * | 10/2002 | Seki et al. .................... 257/778 |
| 6,476,469 | B2 | * | 11/2002 | Hung et al. ................... 257/676 |
| 6,521,987 | B1 | * | 2/2003 | Glenn et al. .................. 257/684 |
| 6,700,186 | B2 | * | 3/2004 | Yasunaga et al. ............ 257/672 |
| 2001/0030355 | A1 | * | 10/2001 | Mclellan et al. ............. 257/666 |
| 2001/0042904 | A1 | * | 11/2001 | Ikenaga et al. .............. 257/666 |
| 2002/0041011 | A1 | * | 4/2002 | Shibata ........................ 257/667 |
| 2002/0079561 | A1 | * | 6/2002 | Yasunaga et al. ............ 257/670 |
| 2002/0121684 | A1 | * | 9/2002 | Kobayakawa ................ 257/676 |

(Continued)

FOREIGN PATENT DOCUMENTS

JP      402211658    * 8/1990

(Continued)

*Primary Examiner*—Laura M. Schillinger
*Assistant Examiner*—James Mitchell
(74) *Attorney, Agent, or Firm*—Peter F. Corless; Steven M. Jensen; Edwards Angell Palmer & Dodge

(57) ABSTRACT

A short-prevented lead frame and a method for fabricating a semiconductor package with the lead frame are proposed, wherein each lead of the lead frame is formed with a thickness-reduced portion at a peripheral position of the lead frame, allowing thickness-reduced portions of adjacent leads to be arranged in a stagger manner. This stagger arrangement significantly increases pitches between the neighboring thickness-reduced portions of leads. Therefore, during a singulation process as to cut through the leads, lead bridging and short-circuiting between adjacent leads caused by cut-side burrs can be prevented from occurrence, whereby singulation quality and product yield and reliability are effectively improved.

5 Claims, 10 Drawing Sheets

U.S. PATENT DOCUMENTS

| | | | | |
|---|---|---|---|---|
| 2002/0153597 A1 * | 10/2002 | Fritzsche et al. | ............ | 257/666 |
| 2003/0001244 A1 * | 1/2003 | Araki et al. | ................ | 257/666 |
| 2003/0006492 A1 * | 1/2003 | Ogasawara et al. | ......... | 257/684 |
| 2003/0042581 A1 * | 3/2003 | Fee et al. | .................... | 257/666 |
| 2003/0073265 A1 * | 4/2003 | Hu et al. | .................... | 438/123 |

FOREIGN PATENT DOCUMENTS

| | | | |
|---|---|---|---|
| JP | 404053252 | * | 2/1992 |
| JP | 410178149 | * | 6/1998 |
| JP | 411307675 | * | 11/1999 |

* cited by examiner

SHORT-PREVENTED LEAD FRAME AND METHOD FOR FABRICATING SEMICONDUCTOR PACKAGE WITH THE SAME

FIELD OF THE INVENTION

The present invention relates to lead frames and methods for fabricating semiconductor packages with the lead frames, and more particularly, to a lead frame for use in a QFN (quad flat non-leaded) semiconductor package and a fabrication method of the semiconductor package.

BACKGROUND OF THE INVENTION

Generally, a QFN (quad flat non-leaded) semiconductor package is basically configured by mounting at least a chip on a die pad of a lead frame, and forming a plurality of conductive elements such as bonding wires for electrically connecting the chip to leads of the lead frame, wherein the chip, bonding wires and lead frame are encapsulated by an encapsulating resin to form an encapsulant. As compared with a QFP (quad flat package) having outer leads that are exposed to outside of the package and used to establish external electrical connection, this QFN semiconductor package, as named, is characterized to be free of exposed outer leads, and thus relatively lower in overall package profile. Moreover, the QFN semiconductor package is adapted to expose bottom surfaces of the die pad and leads to outside of the encapsulant. These exposed surfaces directly urge the semiconductor package to be electrically coupled to an external device such as a printed circuit board (PCB), by which no other conductive elements e.g. solder balls or bumps are necessarily provided for the semiconductor package to serve as I/O (input/output) connections for communicating with the external device, making process complexity and costs of fabrication both considerably reduced.

However, the above conventional QFN semiconductor package is still inherent with significant drawbacks, for example, relatively weak bonding between the encapsulant and lead frame, bridging of adjacent leads during singulation, and so on. This is because that, as described above, the die pad and leads of the QFN semiconductor package are partly exposed and not entirely enclosed by the encapsulant, which thereby weakens bonding strength between the encapsulant and lead frame, and tends to cause delamination between the encapsulant and the die pad or leads, making quality and reliability of the semiconductor package adversely affected.

In accordance with the delamination problem, U.S. Pat. No. 6,081,029 teaches a semiconductor package 1 shown in FIG. 6A. Similar to a conventional QFN semiconductor package, this semiconductor package 1 adopts a lead frame 10 with at least a chip 12 being mounted on a die pad 11 thereof. A plurality of bonding wires 13 are formed to electrically connect the chip 12 to leads 14 of the lead frame 10. All these components of the semiconductor package 1 are encapsulated by an encapsulant 15, wherein bottom surfaces of the die pad 11 and leads 14 are exposed to outside of the encapsulant 15. In particular, the semiconductor package 1 is characterized in forming of a recessed step-like portion 110, which dents upwardly from bottom peripheral edge of the die pad 11, and allows part of the encapsulant 15 to fill into the step-like portion 110, This helps enhancing contact area and bonding strength between the die pad 11 and the encapsulant 15, and thereby reduce the occurrence of delamination.

As shown in FIG. 7A, U.S. Pat. No. 6,229,200 discloses a semiconductor package 2, in which at least a chip 22 is deposited on a die pad 21 of a lead frame 20, and electrically connected to leads 24 of the lead frame 20 by a plurality of bonding wires 23; an encapsulant 25 is formed to encapsulate all the foregoing components of the semiconductor package 2, with bottom surfaces of the die pad 21 and leads 24 being exposed to outside of the encapsulant 25. Similar to the above-described semiconductor package 1, a step-like portion 210 is formed at bottom peripheral edge of the die pad 21 in the semiconductor package 2, so as to reinforce bonding strength between the die pad 21 and the encapsulant 25. Moreover, ends of the leads 24 around the die pad 21 are also formed with step-like portions 240 at bottom edges thereof, by which contact area and bonding strength between the leads 24 and the encapsulant 25 are effectively enhanced. In provision of the step-like portions 210, 240, the lead frame 20 is firmly bonded with the encapsulant 25, and much less likely to delaminate from the encapsulant 25; thereby, reliability of the semiconductor package 2 can be well assured.

However, those above disclosed semiconductor packages are still in concern of the lead bridging problem. During a singulation process, by virtue of metal affinity to a cutting tool, cut-side burrs of the metal-made leads are usually generated when the cutting tool cuts through the leads. As shown in FIGS. 6B and 7B, since the leads 14, 24 of the semiconductor package 1, 2 are densely arranged or low in pitch, cut-side burrs may diffuse along a cutting direction (as indicated by an arrow in the respective drawings) to cause bridging and short-circuiting of adjacent leads, which severely damages quality and yield of singulated products.

Therefore, how to effectively eliminate the drawback of lead bridging caused by diffusion of lead burrs during singulation, and to assure quality and reliability of fabricated products, are significant problems to solve.

SUMMARY OF THE INVENTION

A primary objective of the present invention is to provide a lead frame and a method for fabrication a semiconductor package with the lead frame, in which lead pitch or space between adjacent leads is increased, so as to prevent bridging and short-circuiting of the leads from occurrence during lead singulation, and to assure singulation quality and reliability of fabricated products.

In accordance with the above and other objectives, the present invention proposes a short-prevented lead frame and a method for fabrication a semiconductor package with the lead frame.

The short-prevented lead frame of the invention comprises a plurality of leads extending toward a center of the lead frame, each lead having a top surface and a bottom surface opposed to the top surface, and each lead being formed with a thickness-reduced portion at an end thereof situated at periphery of the lead frame, in a manner that a lead is removed from a top surface of a peripheral end thereof by a predetermined thickness to form a thickness-reduced portion, and an adjacent lead is removed from a bottom surface of a peripheral end thereof by a predetermined thickness to form a thickness-reduced portion, so as to allow the thickness-reduced portion to be smaller in thickness than the lead.

A method for fabricating a semiconductor package with the above-proposed lead frame, comprises the steps of: preparing a lead-frame plate composed of a plurality of array-arranged lead frames and a plurality of connecting portions for interconnecting adjacent lead frames, each lead frame having a centrally-situated die pad and a plurality of leads that extend from periphery toward a center of the lead frame and surround the die pad, and leads of a lead frame being connected to leads of an adjacent lead frame by a corresponding connecting portion, wherein each lead has a top surface, a bottom surface opposed to the top surface, and an end that is situated at periphery of a lead frame and associated with a connecting portion, and wherein the end of the lead and the connecting portion are removed by a predetermined thickness to form a thickness-reduced portion, in a manner that a lead is removed from a top surface of a peripheral end thereof by the predetermined thickness to form a thickness-reduced portion, and an adjacent lead is removed from a bottom surface of a peripheral end thereof by the predetermined thickness to form a thickness-reduced portion, so as to allow the thickness-reduced portion to be smaller in thickness than the lead; mounting at least a chip respectively on the die pad of each lead frame of the lead-frame plate; forming a plurality of conductive elements for electrically connecting the chip to the corresponding leads; forming an encapsulant on the lead-frame plate for encapsulating the lead frame, chips and conductive elements, wherein the bottom surfaces of the leads are exposed to outside of the encapsulant; and performing a singulation process for cutting away the connecting portions, so as to singulate the leads and form individual semiconductor packages.

The invention is characterized in the forming of thickness-reduced portions at ends of leads situated at periphery of a lead frame, wherein thickness-reduced portions are formed by partly removing top or bottom surfaces of the leads, allowing thickness-reduced portions of adjacent leads to be arranged in a stagger manner. This stagger arrangement provides significant benefits. For example, pitch or space between adjacent leads is effectively increased up to three times larger than conventional lead pitch distance. During a singulation process for cutting through the leads, it helps preventing the occurrence of lead bridging or short-circuiting caused by diffusion of cut-side burrs of densely-packed leads as previously discussed for the prior arts. Thereby, in the use of the lead frame of the invention, fabricated semiconductor packages with the lead frames are well assured with singulation quality and product yield and reliability.

BRIEF DESCRIPTION OF THE DRAWINGS

The present invention can be more filly understood by reading the following detailed description of the preferred embodiments, with reference made to the accompanying drawings, wherein:

FIGS. 2–5 are schematic diagrams showing the steps involved in a method for fabricating a semiconductor package with a lead frame of the invention;

DETAILED DESCRIPTION OF THE PREFERRED EMBODIMENT

The following description is made with reference to FIGS. 1A–1D and FIGS. 2–5 for in detail depicting a lead frame proposed in the present invention and a fabrication method of a semiconductor package with the lead frame. The drawings are constructed in a simplified manner as to only illustrate structural components relating to the invention, and the structural components are not exemplified according to practical quantities or sizes; in practice, the lead frame and the semiconductor package should be much more complex in configuration. Moreover, a lead frame for use in a QFN (quad flat non-leaded) semiconductor package is here exemplified; nevertheless, the lead frame of the invention can be more broadly applied.

Figure 1A:
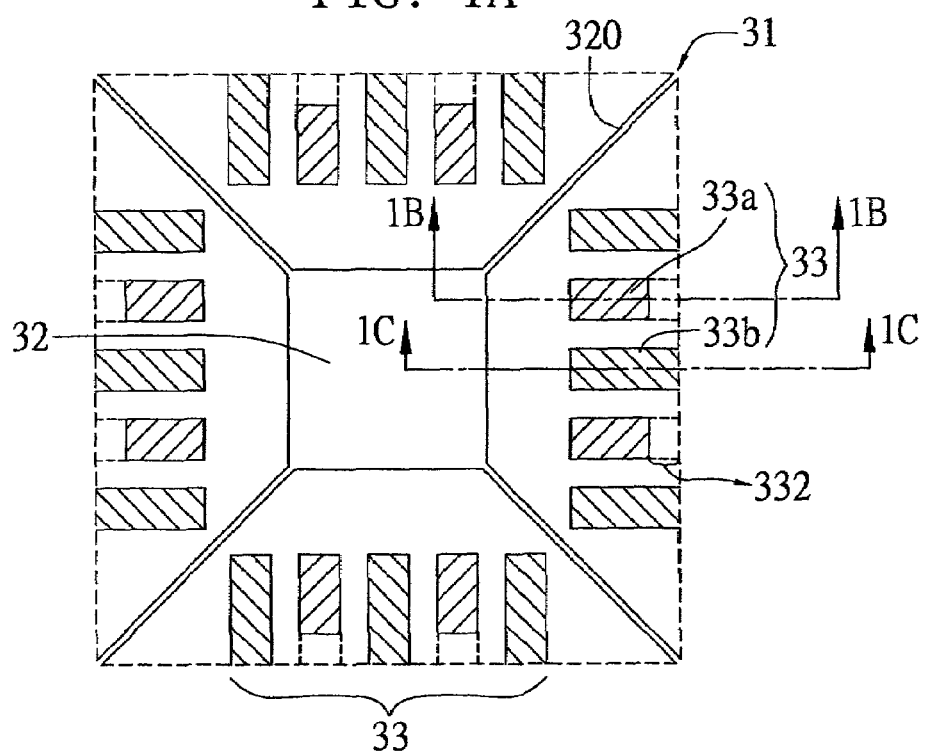
FIG. 1A is a top view of a lead frame of the invention.
Figure 1B:
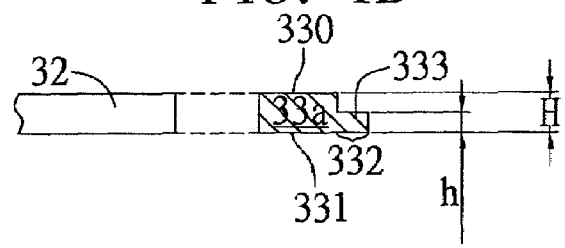
FIG. 1B is a cross-sectional view of the lead frame of FIG. 1A cutting along a line 1B—1B.
Figure 1C:
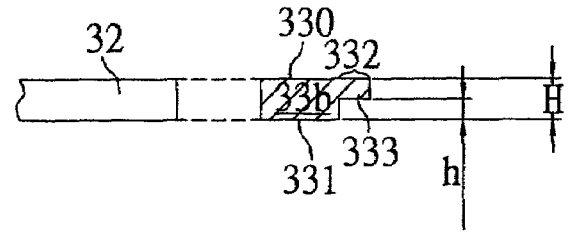
FIG. 1C is a cross-sectional view of the lead frame of FIG. 1A cutting along a line 1C—1C.
Figure 1D:
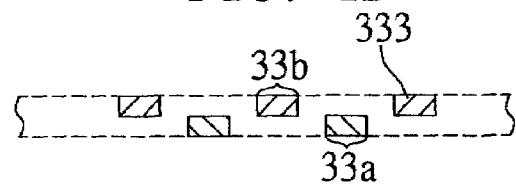
FIG. 1D is a side view of the lead frame of FIG. 1A.

FIGS. 1A–1D illustrate a short-prevented lead frame of the present invention. As shown in the drawings, the lead frame 31 of the invention comprises a centrally-situated die pad 32, and a plurality of leads 33 that extend from periphery toward a center of the lead frame 31 and surround the die pad 32, wherein the die pad 32 is connected to the lead frame 31 by a plurality of tie bars 320. Each of the leads 33 has a top surface 330 and a bottom surface 331 opposed to the top surface 330, and is formed with a thickness-reduced portion 333 at an end 332 thereof situated at periphery of the lead frame 31. Thickness-reduced portions 333 are formed by partly removing the top or bottom surfaces 330, 331 of the leads 33, and thereby the leads 33 are divided into two types of leads 33a, 33b according to forming positions of corresponding thickness-reduced portions 333. As shown in FIG. 1B, a lead 33a is removed by a predetermined thickness from a top surface 330 of its peripheral end 332 to form a thickness-reduced portion 333; whereas in FIG. 1C, a lead 33b is removed by a predetermined thickness from a bottom surface 331 of its peripheral end 332 to form a thickness-reduced portion 333. As a result, the thickness-reduced portion 333 has its thickness h smaller than a thickness H of the lead 33 (i.e. h<H). And, as shown in a side view of FIG. 1D, the thickness-reduced portions 333 of the adjacent leads 33a, 33b are arranged in a stagger manner.

A method for fabricating a semiconductor package in the use of the above-described lead frame 31, is detailed for its process steps with reference to FIGS. 2 to 5. As shown in the drawings, the semiconductor package 3 with the lead frame 31 is fabricated by the following steps.

Figure 2A:
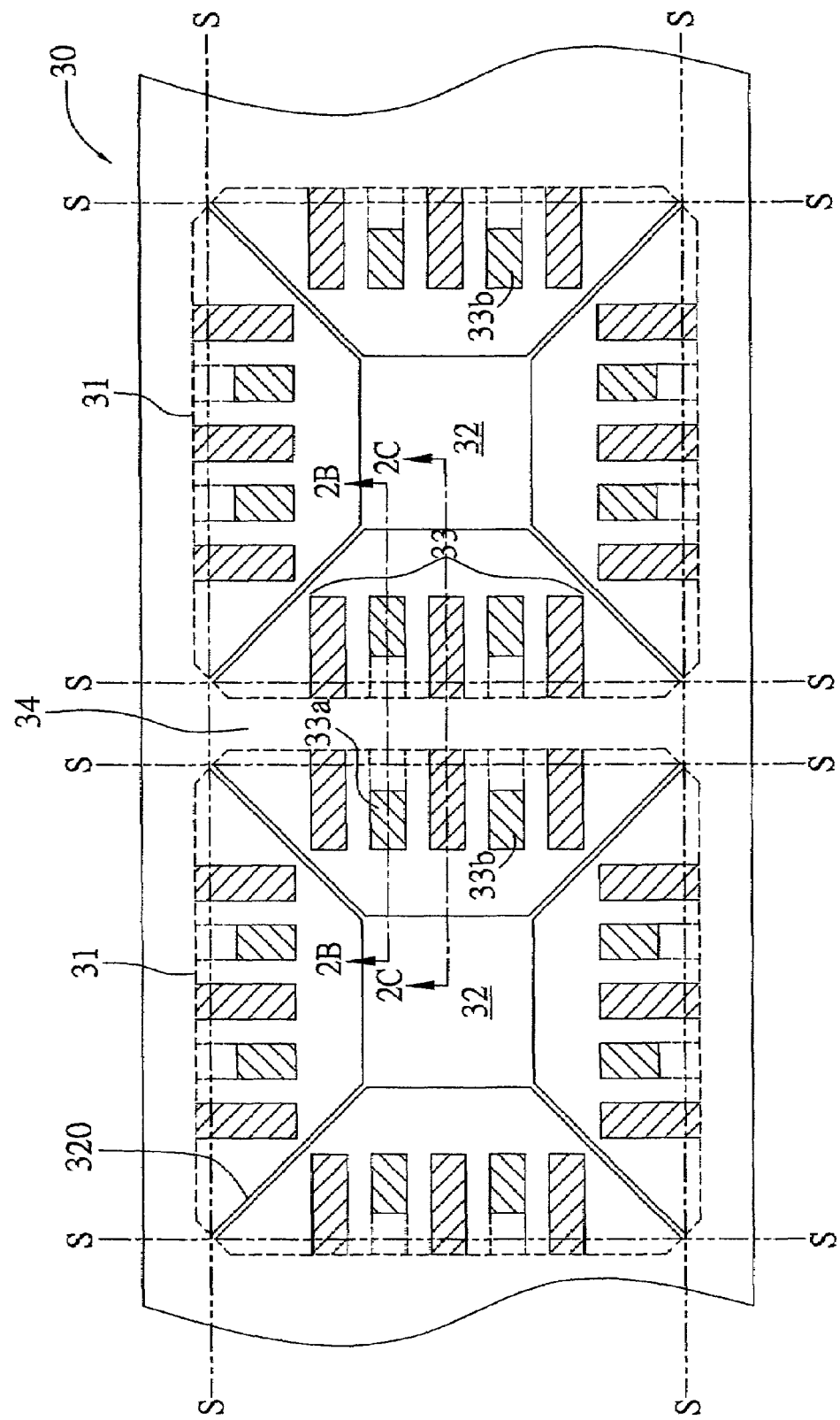
FIGS. 2A–2C are a top view and cross-sectional views of preparing the lead frame of the invention.
Figure 2B:
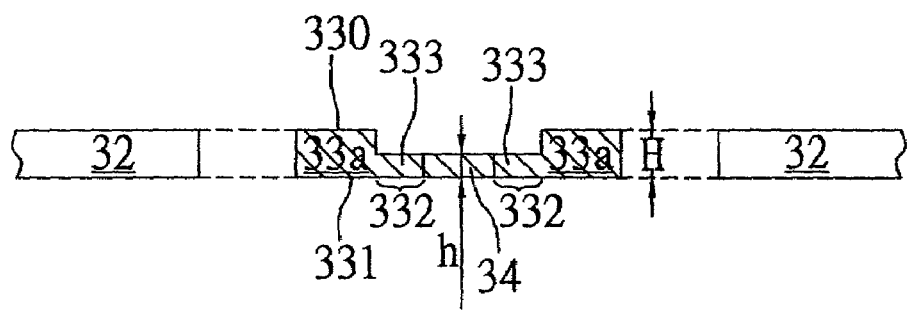
Figure 2C:
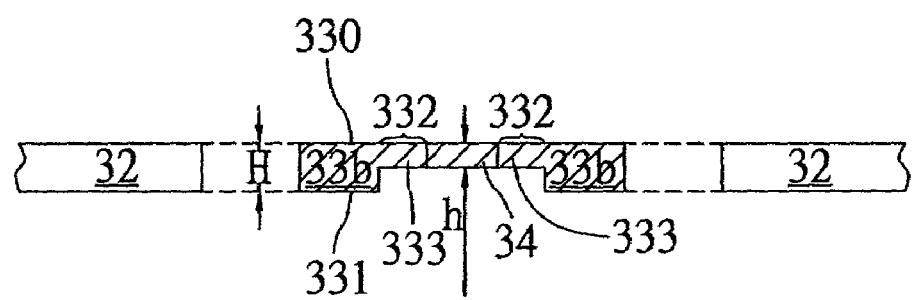

Referring to FIGS. 2A to 2C, the first step is to prepare a lead-frame plate 30, which is structured by a chemical etching or stamping technique, to form a plurality of array-arranged lead frames 31 and a plurality of connecting portions 34 for interconnecting adjacent lead frames 31. Each of the lead frames 31 is defined with a package site by a plurality of cutting lines S-S for use in a subsequent singulation process (described later). Only two lead frames 31 are illustrated in the drawings; it should be understood that, much more lead frames 31 consist the lead-frame plate 30.

As shown in FIG. 2A, each lead frame 31 is composed of a centrally-situated die pad 32, and a plurality of leads 33 that extend from periphery toward a center of the lead frame 31 and surround the die pad 32, wherein the die pad 32 is connected to the lead frame 31 by a plurality of tie bars 320. An adjacent lead frame 31 is connected by a corresponding connecting portion 34.

Each of the leads 33 has a top surface 330, a bottom surface 331 opposed to the top surface 330, and an end 332 that is situated at periphery of a lead frame 31 and associated with a connecting portion 34. The end 332 of the lead 33 and the connecting portion 34 are removed by a predetermined thickness to form a thickness-reduced portion 333. Thickness-reduced portions 333 are formed by half-etching top or bottom surfaces 330, 331 of the leads 33, and thereby the leads 33 are divided into two types of leads 33a, 33b according to forming positions of corresponding thickness-reduced portions 333. As shown in FIG. 2B, a lead 33a is half-etched by the predetermined thickness from a top surface 330 of its peripheral end 332 to form a thickness-reduced portion 333; whereas in FIG. 2C, a lead 33b is half-etched by the predetermined thickness from a bottom surface 331 of its peripheral end 332 to form a thickness-reduced portion 333. As a result, the thickness-reduced portion 333 has its thickness h smaller than a thickness H of the lead 33 (i.e. h<H); more particularly, the thickness-reduced portion 333 is dimensioned to be half in thickness of the lead 33, i.e. H=2h.

Figure 3A:
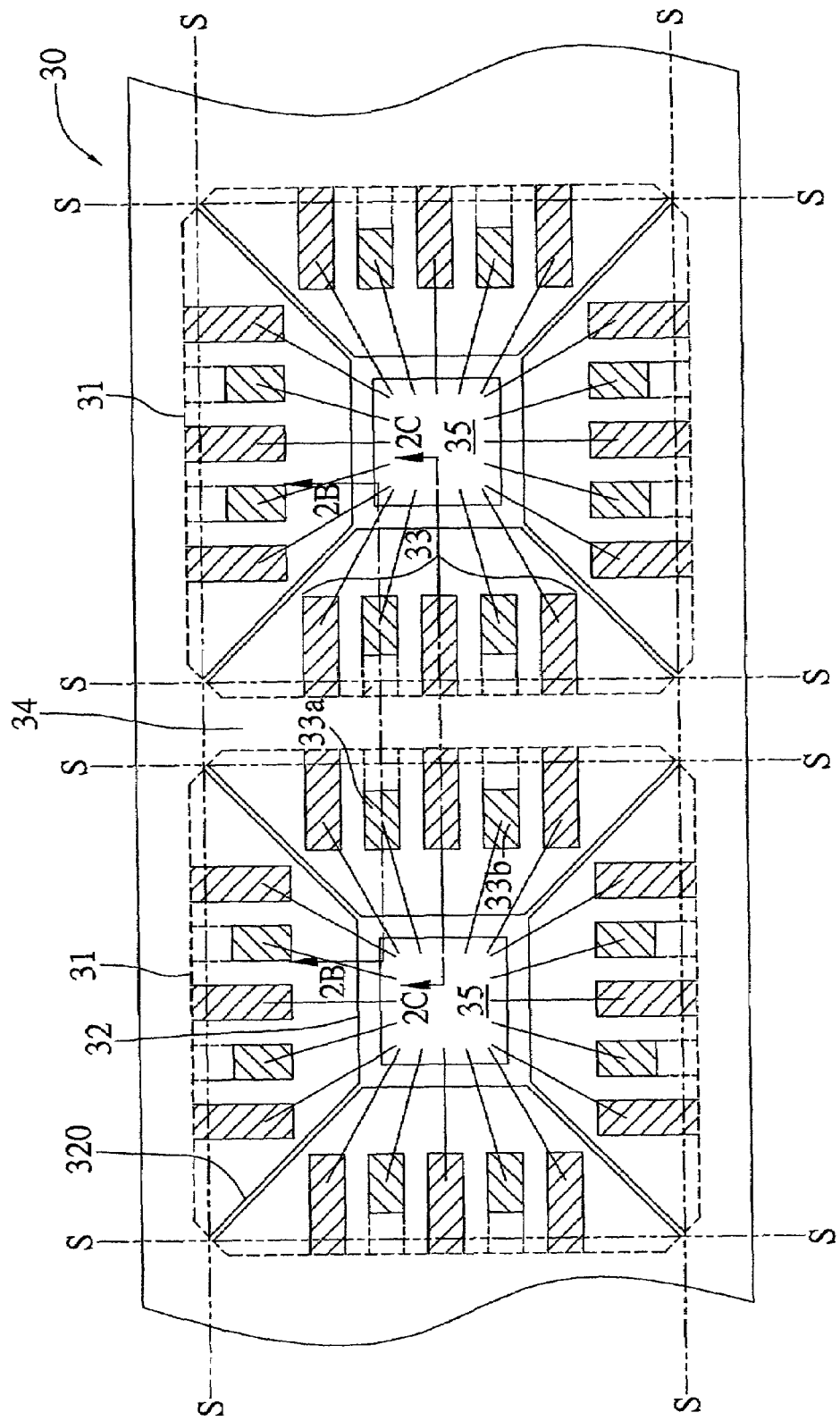
FIGS. 3A–3C are a top view and cross-sectional views of performing a die bonding process and a wire bonding process for the lead frame of FIGS. 2A–2C of the invention.
Figure 3B:
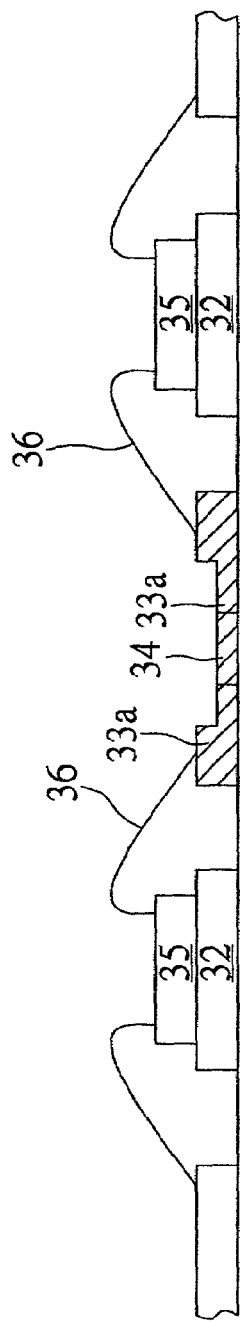
Figure 3C:
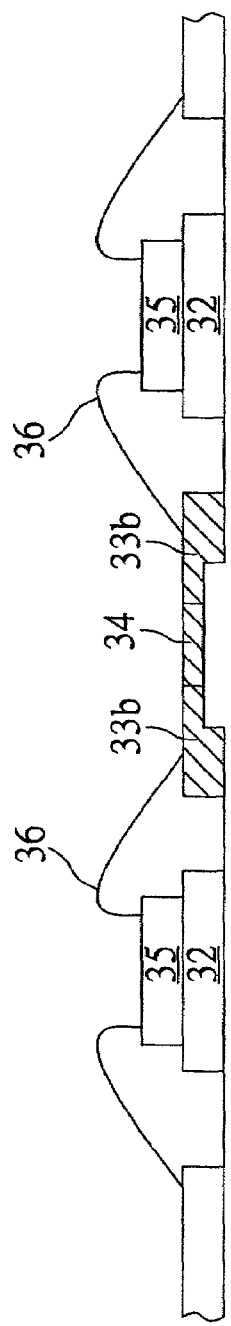

Referring to FIGS. 3A to 3C, after preparing the lead-frame plate 30, the next step is to perform a die bonding process, by which at least a chip 35 is mounted respectively on the die pad 32 of each lead frame 31 of the lead-frame plate 30. Then, a wire bonding process is conducted to form a plurality of bonding wires 36 such as gold wires on the respective lead frames 31, so as to allow the chips 35 to be electrically connected to corresponding leads 33 by the bonding wires 36. Since the die bonding and wire bonding processes are conventional technology, they are not to be further detailed herein.

Figure 4A:
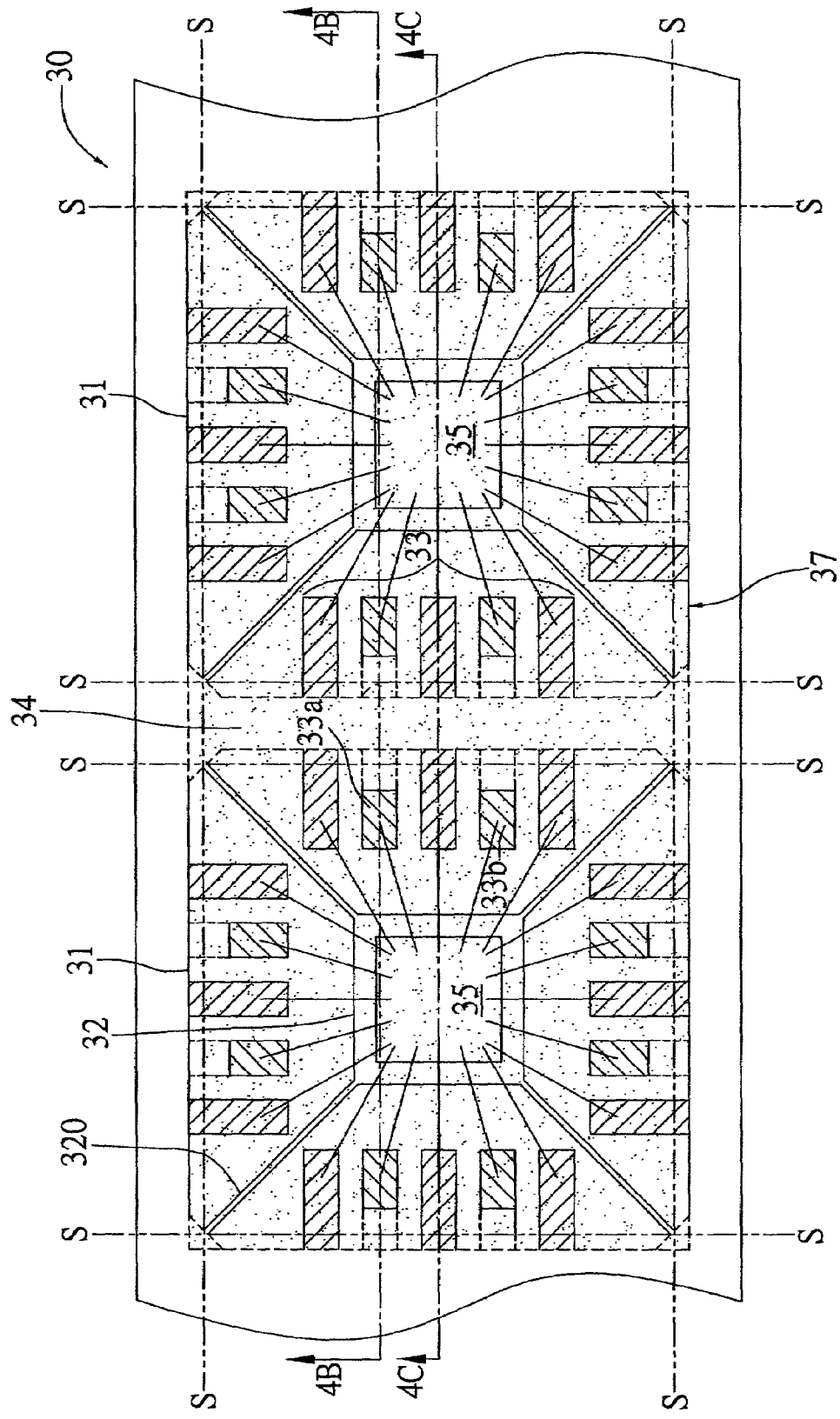
FIGS. 4A–4C are a top view and cross-sectional views of performing a molding process for the semi-fabricated semiconductor structure of FIGS. 3A–3C of the invention.
Figure 4B:
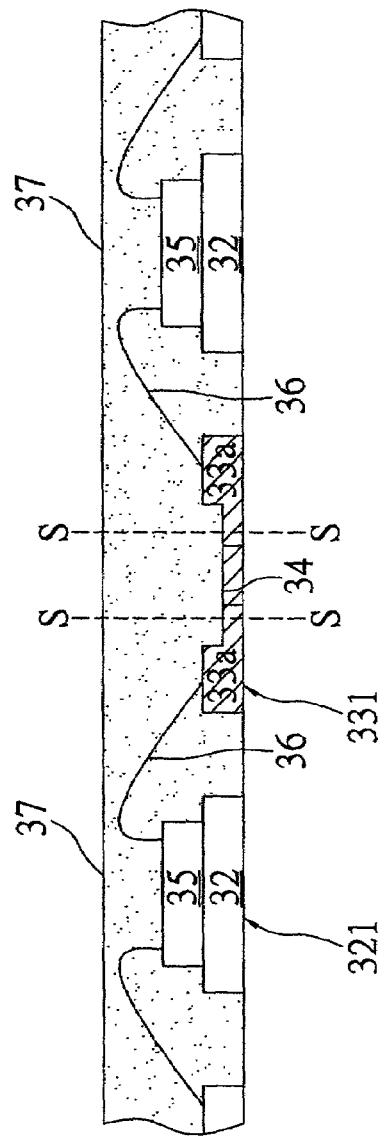
Figure 4C:
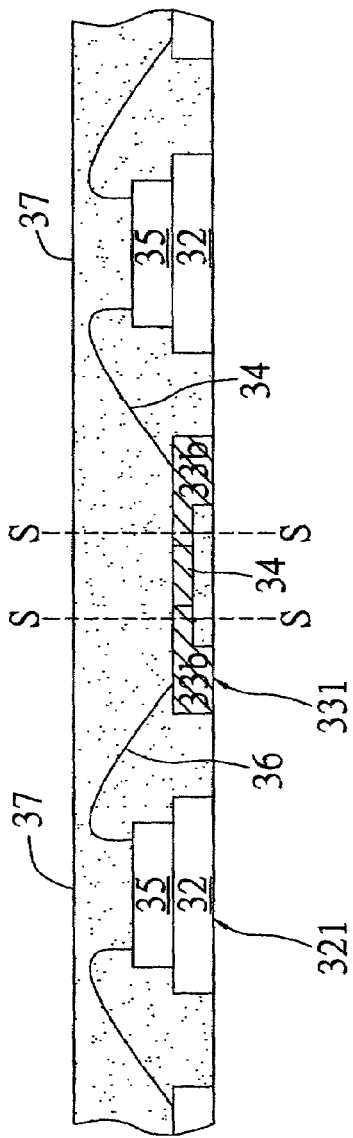

Referring further to FIGS. 4A to 4C, a molding process is performed, whereby an encapsulant 37 is formed on the lead-frame plate 30 by a conventional resin material such as epoxy resin. The encapsulant 37 encapsulates the die pads 32 and leads 32 of the lead frames 31, the chips 35 and bonding wires 36 and the connecting portions 34, wherein bottom surfaces 321 of the die pads 32 and the bottom surfaces 331 of the leads 33 are exposed to outside of the encapsulant 37.

Figure 5A:
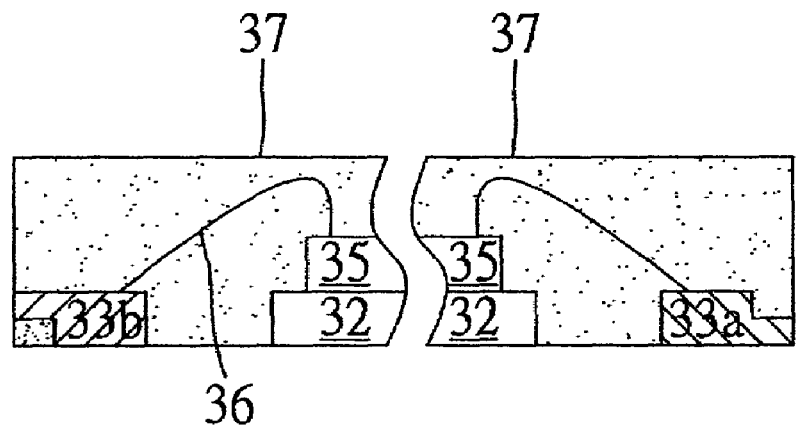
FIGS. 5A and 5B are a cross-sectional view and a side view after performing a singulation process for the semi-fabricated semiconductor structure of FIGS. 4A–4C of the invention.
Figure 5B:
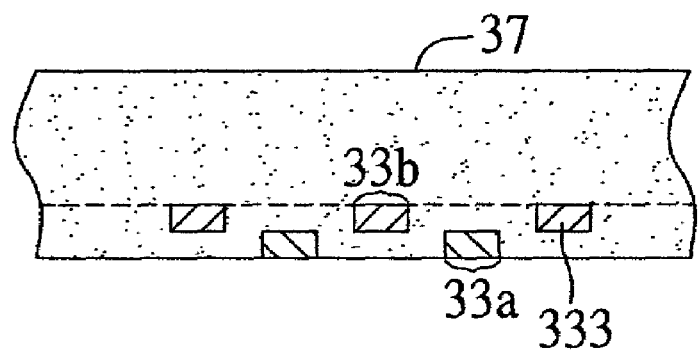
Figure 6A:
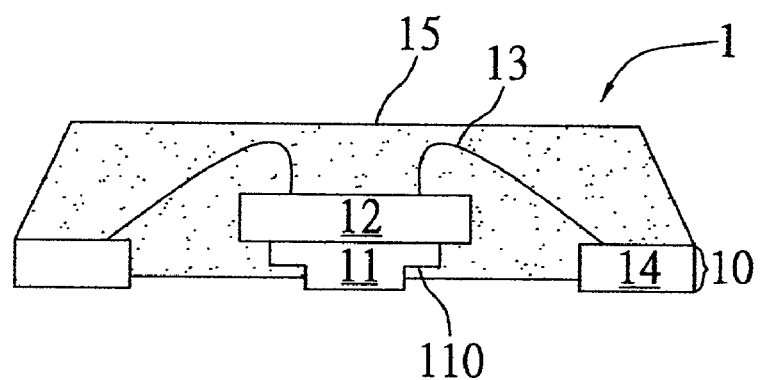
FIGS. 6A and 6B (PRIOR ART) are a cross-sectional view and a side view of a semiconductor package disclosed by U.S. Pat. No. 6,081,029.
Figure 6B:
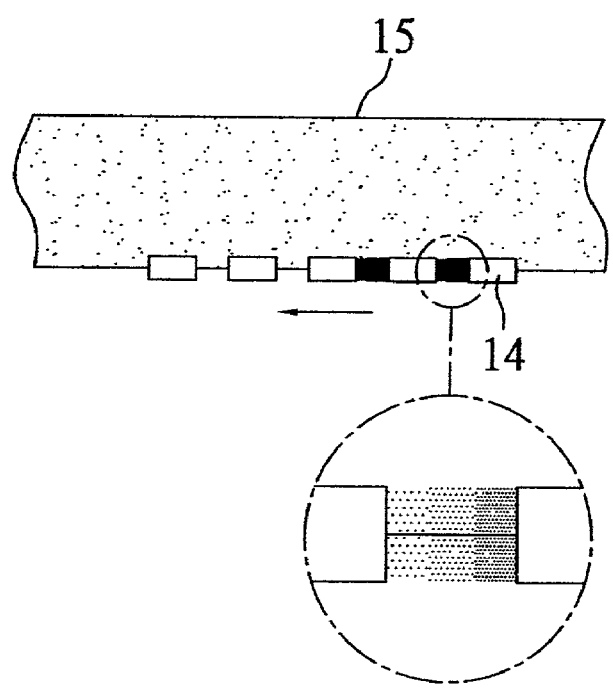
Figure 7A:
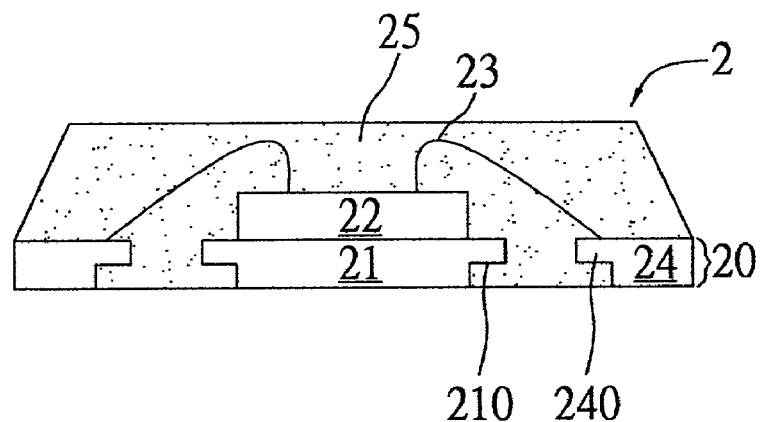
FIGS. 7A and 7B (PRIOR ART) are a cross-sectional view and a side view of a semiconductor package disclosed by U.S. Pat. No. 6,229,200.
Figure 7B:
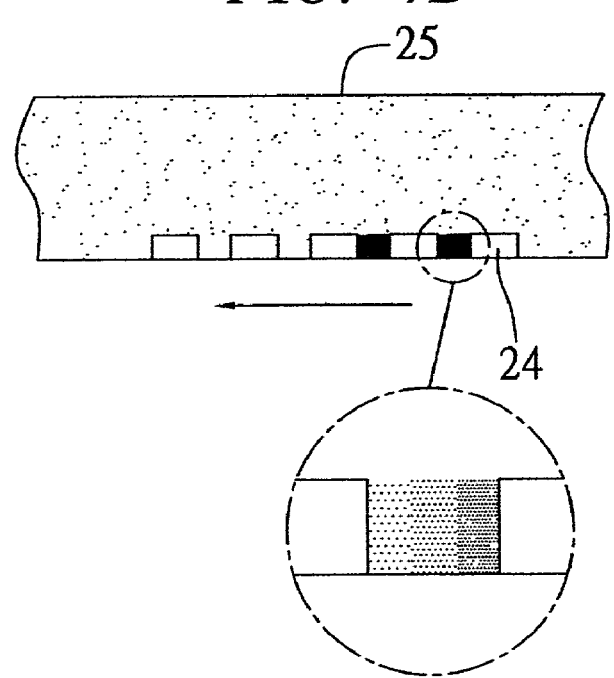

Finally, a singulation process is performed through the use of a conventional cutting machine, which cuts along the cutting lines S-S defined on the lead frames 31 to form individual semiconductor packages 3. The cutting lines S-S go through the leads 33 (or the thickness-reduced portions 333); in other words, a package site defined on a lead frame 31 by the cutting lines S-S is slightly smaller than area encompassed by periphery of the lead frame 31, and thereby, connecting portions 34 and small part of leads 33 are cut away during singulation. As such, the leads 33 of each lead frame 31 can be surely singulated and completely separated from each other, and this completes fabrication of the semiconductor packages 3 of the invention, as shown in FIG. 5A. FIG. 5B illustrates a side view of a singulated semiconductor package 3, in which the thickness-reduced portions 333 of adjacent leads 33a, 33b are arranged in a stagger manner. Subsequently, the singulated semiconductor package 3 can be electrically connected to an external device such as a printed circuit board by exposed surfaces 321, 331 of its die pad 32 and leads 33 for further operation, without the need to adopt other conductive elements such as solder balls or bumps to serve as I/O connections for external electrical communication. This is a substantial characteristic of a QFN semiconductor package.

In conclusion, the invention is characterized in the forming of thickness-reduced portions at ends of leads situated at periphery of a lead frame, wherein thickness-reduced portions are formed by partly removing top or bottom surfaces of the leads, allowing thickness-reduced portions of adjacent leads to be arranged in a stagger manner. This stagger arrangement provides significant benefits. For example, pitch or space between adjacent leads is effectively increased up to three times larger than conventional lead pitch distance because of the stagger arrangement for thickness reduced. During a singulation process for cutting through the leads, it helps preventing the occurrence of lead bridging or short-circuiting caused by diffusion of cut-side burrs of densely-packed leads as previously discussed for the prior arts. Thereby, in the use of the lead frame of the invention, fabricated semiconductor packages with the lead frames are well assured with singulation quality and product yield and reliability.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A short-prevented lead frame, comprising a plurality of leads each having an inner end extending toward a center of the lead frame and an outer end situated at a periphery away from the center of the lead frame, the outer end facing in a direction away from the center of the lead frame, and each lead having a top surface and a bottom surface opposed to the top surface, wherein a thickness-reduced portion is formed at the outer end of each of the leads, such that the thickness-reduced portions or neighboring leads are arranged in a stagger manner in which a lead has its thickness-reduced portion formed on the top surface of the outer end, and an adjacent lead has its thickness-reduced portion formed on the bottom surface of the outer end, each thickness-reduced portion being smaller in thickness than a remainder of its respective lead, wherein the thickness-reduced portion of each of the leads faces in the direction away from the center of the lead frame.

2. The lead frame of claim 1, wherein the thickness-reduced portion is dimensioned to be about one-half the thickness of the lead.

3. The lead frame of claim 1, further comprising a die pad formed at the center or the lead frame and surrounded by the leads.

4. The lead frame of claim 3, wherein the die pad is connected to the lead frame by tie bars.

5. The lead frame of claim 3, wherein a bottom surface of the die pad is flush with the bottom surfaces of the leads.

* * * * *